United States Patent
Ioka et al.

(10) Patent No.: US 6,448,331 B1
(45) Date of Patent: Sep. 10, 2002

(54) ALKOXYSILANE/ORGANIC POLYMER COMPOSITION FOR THIN INSULATING FILM PRODUCTION AND USE THEREOF

(75) Inventors: Takaaki Ioka; Tsuneaki Tanabe, both of Fuji (JP)

(73) Assignee: Asahi Kasei Kabushiki Kaisha, Tokyo (JP)

(*) Notice: Subject to any disclaimer, the term of this patent is extended or adjusted under 35 U.S.C. 154(b) by 0 days.

(21) Appl. No.: 09/423,798

(22) PCT Filed: Jul. 15, 1998

(86) PCT No.: PCT/JP98/03186

§ 371 (c)(1),
(2), (4) Date: Nov. 12, 1999

(87) PCT Pub. No.: WO99/03926

PCT Pub. Date: Jan. 28, 1999

(30) Foreign Application Priority Data

Jul. 15, 1997 (JP) .............................. 9-189731
Jul. 15, 1997 (JP) .............................. 9-189767

(51) Int. Cl.⁷ ..................... C08G 77/02; C08G 77/18
(52) U.S. Cl. ..................... 524/859; 524/858; 528/26; 528/29; 528/39; 528/10; 423/339; 423/335; 428/412; 428/447; 428/448; 428/781; 525/903; 525/419; 525/474; 525/464; 427/226; 427/387; 501/82; 501/53
(58) Field of Search ................. 524/859, 858; 525/903, 464, 474, 419; 501/82, 53; 427/226, 387; 438/781; 423/339, 335; 428/412, 447, 448; 528/39, 29, 26, 10

(56) References Cited

U.S. PATENT DOCUMENTS

| | | | | |
|---|---|---|---|---|
| 4,413,088 A | * | 11/1983 | Frye | 524/714 |
| 4,446,171 A | * | 5/1984 | Thomas | 427/160 |
| 4,584,280 A | * | 4/1986 | Nanao et al. | 501/80 |
| 5,412,016 A | * | 5/1995 | Sharp | 524/430 |
| 5,457,166 A | * | 10/1995 | Yoshikawa et al. | 525/446 |
| 5,470,802 A | * | 11/1995 | Gnade et al. | 437/238 |
| 5,472,913 A | | 12/1995 | Havemann et al. | 437/195 |
| 5,700,844 A | | 12/1997 | Hedrick et al. | 521/77 |
| 5,858,462 A | * | 1/1999 | Yamazaki | 427/226 |

FOREIGN PATENT DOCUMENTS

| | | | |
|---|---|---|---|
| JP | 57190645 | | 11/1982 |
| JP | 4130026 | * | 5/1992 |
| JP | 6322136 | | 11/1994 |
| JP | 7100389 | | 4/1995 |
| JP | 7-100389 | | 4/1995 |
| JP | 7185306 | | 7/1995 |
| JP | 8-245278 | | 9/1996 |
| JP | 8245278 | | 9/1996 |
| WO | WO9613853 A1 | | 5/1996 |

OTHER PUBLICATIONS

R. D. Miller, "Modified Silsesquioxane Structures for Use in Low Dielectric Constant Interconnect Applications," T. J. Watson Research Center, Yorktown Heights, NY 10598, Feb. 16–17, 1998, DUMIC Conference 1998, IMIC—333D/98/0293, pp. 293–294.

Wei, Q.; Chu, C. T. and Chu, Cheng–Jye, "Direct Patterning Low–K Material For Damacene Process," Chemat Technology, Inc. 19365 Bueiness Center Dr. #8&9, Northridge, CA 91324, Feb. 10–11, 1997, DUMIC Conference 1997, ISMIC—222D/97/0093, pp. 93–97.

Ohgawara, Takashi et al., "Control of pore size distribution of silica gel through sol–gel process using water soluble polymers as additives," Journal of Materials Science 25 (1990) pp. 4880–4885, North–Holland, Amsterdam.

Tsutomu Minami, et al., "Fine–Patterning on Glass Substrates by the Sol–Gel Method," Journal of Non–Crystalline Solids 100 (1988) pp. 501–505, Elsevier Science Publishers, B. V., North–Holland Physics Publishing Division.

Chujo, Yoshiki and Saegusa, Takeo, "An Organic/Inorganic Hybrid Polymer," J. Macromol, Scie.—Chem., !27 (13 & 14), pp. 1603–162 (1990).

Database WPI, Section CH, Week 199630; Derwent Publications Ltd., London, GB; Class A26, AN 1996–239699; XP–002167154; corresponding to JP 08 130247 A (May 21, 1996).

* cited by examiner

Primary Examiner—Margaret G. Moore
(74) Attorney, Agent, or Firm—Birch, Stewart, Kolasch & Birch, LLP

(57) ABSTRACT

Disclosed is an alkoxysilane/organic polymer composition for use in producing an insulating thin film, comprising (A) a specific alkoxysilane; (B) a specific organic polymer; and (C) a solvent for alkoxysilane (A) and organic polymer (B), wherein solvent (C) comprises at least one organic solvent selected from the group consisting of amide linkage-containing organic solvents and ester linkage-containing organic solvents. Also disclosed are a silica-organic polymer composite thin film which is produced by a process comprising: forming a thin film of the composition of the present invention; subjecting the thin film to a hydrolysis and dehydration-condensation reaction with respect to the alkoxysilane thereof, to thereby cause the alkoxysilane to be gelled in the thin film; and removing the solvent remaining in the thin film by drying, and a porous silica thin film which is obtained by removing the organic polymer from the silica-organic polymer composite thin film. Both of the silica-organic polymer composite thin film and the porous silica thin film have advantages not only in that these thin films have a low dielectric constant suitable for insulating layers for a multilevel interconnect for a semiconductor device, but also in that these thin films can be produced by a method which can be easily performed in the current process for producing a semiconductor device.

14 Claims, No Drawings

ALKOXYSILANE/ORGANIC POLYMER COMPOSITION FOR THIN INSULATING FILM PRODUCTION AND USE THEREOF

This application is the national phase under 35 U.S.C. §371 of PCT International Application No. PCT/JP98/03186 which has an International filing date of Jul. 15, 1998, which designated the United States of America.

BACKGROUND OF THE INVENTION

1. Field of the Invention

The present invention relates to an alkoxysilane/organic polymer composition for use in producing an insulating thin film.

More particularly, the present invention is concerned with an alkoxysilane/organic polymer composition for use in producing an insulating thin film, comprising (A) a specific alkoxysilane; (B) a specific organic polymer; and (C) a solvent for alkoxysilane (A) and organic polymer (B), wherein the solvent (C) comprises at least one organic solvent selected from the group consisting of amide linkage-containing organic solvents and ester linkage-containing organic solvents. In a current process for producing a semiconductor device, a silicon oxide insulating layer is produced by a method comprising dissolving a silicon oxide precursor in an appropriate solvent to thereby obtain a solution of the silicon oxide precursor, forming a coating of the obtained solution on a substrate by spin coating technique or the like, and calcining the coating at an appropriate temperature. When the composition of the present invention is used as a material for an insulating layer in the production of a multilevel interconnect for a semiconductor device, an insulating layer having a low dielectric constant can be produced by a method which can be easily performed in the current process for producing a semiconductor device. The present invention is also concerned with a multilevel interconnect for a semiconductor device, which comprises a plurality of insulating layers and circuits formed on the insulating layers, wherein at least one layer of the insulating layers is obtained using the above-mentioned composition. Further, the present invention is concerned with a semiconductor device comprising the above-mentioned multilevel interconnect.

2. Background Art

Conventionally, as a material for an insulating layer for a multilevel interconnect for a semiconductor device, such as an LSI, silica (having a dielectric constant of from 4.0 to 4.5) or the like has generally been used. In recent years, the density of the circuit of a semiconductor device (such as an LSI) has become higher and higher, and, hence, the distance between mutually adjacent conducting lines in the circuit has become extremely small. As a consequence of this, the mutually adjacent conducting lines having insulators therebetween have inadvertently come to function as a condenser. This has posed a problem that, when the dielectric constant of the insulator is high, the electrostatic capacity of the condenser inadvertently formed by the mutually adjacent conducting lines and the insulators present therebetween becomes high, so that the transmission of the electric signals through each of the mutually adjacent conducting lines is markedly delayed. In order to solve this problem, with respect to a material for an insulating layer for a multilevel interconnect, studies have been made to develop a material having a much lower dielectric constant.

It is known that, among conventional materials, polytetrafluoroethylene has a lowest dielectric constant, which is approximately 1.9. However, in general, fluororesins have a problem in that fluororesins have not only poor adhesion to a substrate and a circuit but also poor heat resistances. Further, in recent years, the dielectric constant of an insulating layer is required to be less than 1.9.

On the other hand, attempts have been made in which the dielectric constant of a conventional material is decreased by rendering the material porous, thereby providing a porous material which is a composite comprised of the conventional material and air (having a dielectric constant of 1.0).

A silica aerogel (which is a type of porous silica) is a representative example of such porous materials. However, production of a silica aerogel requires supercritical drying. Therefore, production of a silica aerogel requires not only a long time, but also extremely complicated steps of operations using a specially designed apparatus, so that it is practically impossible to introduce a step for producing a silica aerogel insulating layer into the current process for producing a semiconductor device.

U.S. Pat. No. 5,472,913 discloses a method for producing a porous silica by a special technique requiring no supercritical drying. However, this method still requires extremely complicated steps of operations, so that it is difficult to introduce a step in which a porous silica insulating layer is produced by this method into the current process for producing a semiconductor device.

*Journal of Macromolecular Science-Chemistry*, A27, 13–14 p.1603 (1990) discloses a method for producing a porous silica, which comprises subjecting an alkoxysilane to a hydrolysis and dehydration-condensation reaction in the presence of a specific organic polymer so as to cause a gelation of the alkoxysilane, thereby obtaining a homogeneous organic-inorganic composite comprised of the organic polymer and silica, and heating the obtained composite for calcination so that the organic polymer in the composite can be thermally decomposed and removed, thereby obtaining a porous silica. However, in this method, the calcination for completely decomposing and removing the organic polymer is required to be conducted in an atmosphere of air at a temperature as high as 600° C. or more, so that it is impossible to introduce a step in which a porous silica insulating layer is produced by this method into the current process for producing a semiconductor device.

Further, as described below, methods for producing a porous thin film or the like, which are similar to the above-mentioned method disclosed in *Journal of Macromolecular Science-Chemistry*, are disclosed in Unexamined Japanese Patent Application Laid-Open Specification Nos. 8-245278 and 7-100389 and WO97/06896.

Unexamined Japanese Patent Application Laid-Open Specification No. 8-245278 discloses a method for producing a porous ceramic thin film, which comprises coating a substrate with an alcohol solution of a metal alkoxide, which solution contains polyethylene glycol added thereto, and calcining the resultant coating.

Unexamined Japanese Patent Application Laid-Open Specification No. 7-100389 discloses a method for producing a carrier for a catalyst for use in petroleum refining, which comprises subjecting a metal alkoxide to a hydrolysis and dehydration-condensation reaction in the presence of an organic polymer, and calcining the resultant product.

WO97/06896 discloses a method for producing a porous metal oxide film, which comprises dissolving a metal alkoxide, an acid and an organic polymer in a mixed solvent of a first solvent and water to thereby obtain a coating solution, coating the obtained solution onto a glass substrate to form a gel film on the substrate, drying the gel film, immersing the dried gel film in a second solvent to extract and remove the organic polymer from the gel film, and calcining the gel film to thereby obtain a porous metal oxide film.

It is noted that, in each of the methods disclosed in Unexamined Japanese Patent Application Laid-Open Specification Nos. 8-245278 and 7-100389 and WO97/06896, an alcohol is used as a solvent for each of the metal alkoxide and the organic polymer. For the reason as described below, the use of an alcohol as a solvent disadvantageously causes a lowering of the void ratio of an obtained porous material, thereby making it impossible to obtain such a porous insulating thin film having a low dielectric constant as can be suitably used in a multilevel interconnect for a semiconductor device.

As is apparent from the above, such an insulating thin film having a low dielectric constant as can be suitably used in a multilevel interconnect for a semiconductor device has conventionally been unable to be produced by a method which can be easily performed in the current process for producing a semiconductor device.

SUMMARY OF THE INVENTION

In this situation, the present inventors have made extensive and intensive studies with a view toward developing an insulating thin film for use in a multilevel interconnect for a semiconductor device, wherein the insulating thin film not only has a low dielectric constant, but also can be produced by a method which can be easily performed in the current process for producing a semiconductor device. As a result, it has unexpectedly been found that the above objective can be attained by using an alkoxysilane/organic polymer composition comprising (A) a specific alkoxysilane; (B) a specific organic polymer; and (C) a solvent for alkoxysilane (A) and organic polymer (B), wherein the solvent (C) comprises at least one organic solvent selected from the group consisting of amide linkage-containing organic solvents and ester linkage-containing organic solvents. More specifically, it has unexpectedly been found that an insulating thin film produced from the above alkoxysilane/organic polymer composition not only has a low dielectric constant which is suitable for an insulating layer for a multilevel interconnect for a semiconductor device, but also can be produced by a method which can be easily performed in the current process for producing a semiconductor device, wherein the insulating thin film is either a silica-organic polymer composite thin film (produced by forming a thin film from the above alkoxysilane/organic polymer composition and then subjecting the thin film to heat treatment) or a porous silica thin film (obtained by removing the organic polymer from the silica-organic polymer composite thin film). The present invention has been completed, based on the above novel finding.

Therefore, it is a primary object of the present invention to provide a composition for use in producing an insulating layer for a multilevel interconnect for a semiconductor device, wherein the insulating layer not only has a low dielectric constant, but also can be produced by a method which can be easily performed in the current process for producing a semiconductor device.

It is another object of the present invention to provide a composite insulating thin film which can be produced from the above-mentioned composition, and a porous silica thin film which can be obtained from the above composite insulating thin film, as well as the uses of these thin films.

The foregoing and other objects, features and advantages of the present invention will be apparent to those skilled in the art from the following detailed description and appending claims.

DETAILED DESCRIPTION OF THE INVENTION

In one aspect of the present invention, there is provided an alkoxysilane/organic polymer composition for use in producing an insulating thin film, comprising:

(A) at least one alkoxysilane selected from the group consisting of (1) tetraalkoxysilanes, (2) trialkoxysilanes, (3) dialkoxysilanes, (4) monoalkoxysilanes and (5) trialkoxysilane dimers, respectively, represented by the following formulae (1), (2), (3), (4) and (5):

$$Si(OR)_4 \qquad (1),$$

$$R^1Si(OR)_3 \qquad (2),$$

$$R^1R^2Si(OR)_2 \qquad (3),$$

$$R^1R^2R^3SiOR \qquad (4),$$

and $$(RO)_3Si-R^4-Si(OR)_3 \qquad (5),$$

wherein each R independently represents a straight chain or branched alkyl group having 1 to 6 carbon atoms, each of $R^1$, $R^2$ and $R^3$ independently represents a hydrogen atom or a monovalent hydrocarbon group having 1 to 6 carbon atoms, and $R^4$ represents a divalent hydrocarbon group having 1 to 6 carbon atoms, and wherein, when the alkoxysilane (A) is at least one first alkoxysilane selected from the group consisting of the alkoxysilanes (3) and (4), the first alkoxysilane is used in combination with at least one second alkoxysilane selected from the group consisting of the alkoxysilanes (1), (2) and (5);

(B) at least one organic polymer having a main chain mainly comprising at least one polymer chain selected from the group consisting of an aliphatic polyether chain having ether group-containing recurring units having 2 to 12 carbon atoms, an aliphatic polyester chain having ester group-containing recurring units having 2 to 12 carbon atoms, an aliphatic polycarbonate chain having carbonate group-containing recurring units having 2 to 12 carbon atoms and an aliphatic polyanhydride chain having anhydride group-containing recurring units having 2 to 12 carbon atoms; and (C) a solvent for the alkoxysilane (A) and the organic polymer (B), wherein the solvent (C) comprises at least one organic solvent selected from the group consisting of amide linkage-containing organic solvents and ester linkage-containing organic solvents, and wherein at least a part of the alkoxysilane (A), which is at least one alkoxysilane selected from the group consisting of the alkoxysilanes (1) to (5), is optionally in at least one form selected from the group consisting of an oligomer form and an at least partially hydrolyzed form.

For easy understanding of the present invention, the essential features and various embodiments of the present invention are enumerated below.

1. An alkoxysilane/organic polymer composition for use in producing an insulating thin film, comprising:

(A) at least one alkoxysilane selected from the group consisting of (1) tetraalkoxysilanes, (2) trialkoxysilanes, (3) dialkoxysilanes, (4) monoalkoxysilanes and (5) trialkoxysilane dimers, respectively, represented by the following formulae (1), (2), (3), (4) and (5):

$$Si(OR)_4 \quad (1),$$

$$R^1Si(OR)_3 \quad (2),$$

$$R^1R^2Si(OR)_2 \quad (3),$$

$$R^1R^2R^3SiOR \quad (4),$$

and $$(RO)_3Si-R^4-Si(OR)_3 \quad (5),$$

wherein each R independently represents a straight chain or branched alkyl group having 1 to 6 carbon atoms, each of $R^1$, $R^2$ and $R^3$ independently represents a hydrogen atom or a monovalent hydrocarbon group having 1 to 6 carbon atoms, and $R^4$ represents a divalent hydrocarbon group having 1 to 6 carbon atoms, and wherein, when the alkoxysilane (A) is at least one first alkoxysilane selected from the group consisting of the alkoxysilanes (3) and (4), the first alkoxysilane is used in combination with at least one second alkoxysilane selected from the group consisting of the alkoxysilanes (1), (2) and (5);

(B) at least one organic polymer having a main chain mainly comprising at least one polymer chain selected from the group consisting of an aliphatic polyether chain having ether group-containing recurring units having 2 to 12 carbon atoms, an aliphatic polyester chain having ester group-containing recurring units having 2 to 12 carbon atoms, an aliphatic polycarbonate chain having carbonate group-containing recurring units having 2 to 12 carbon atoms and an aliphatic polyanhydride chain having anhydride group-containing recurring units having 2 to 12 carbon atoms; and (C) a solvent for the alkoxysilane (A) and the organic polymer (B), wherein the solvent (C) comprises at least one organic solvent selected from the group consisting of amide linkage-containing organic solvents and ester linkage-containing organic solvents, and wherein at least a part of the alkoxysilane (A), which is at least one alkoxysilane selected from the group consisting of the alkoxysilanes (1) to (5), is optionally in at least one form selected from the group consisting of an oligomer form and an at least partially hydrolyzed form.

2. The composition according to item 1 above, wherein the alkoxysilane (A) is a mixture of at least one tetraalkoxysilane (1) and at least one alkoxysilane selected from the group consisting of the alkoxysilanes (2) to (5).

3. The composition according to item 1 above, wherein the alkoxysilane (A) is at least one trialkoxysilane (2), or a mixture of at least one trialkoxysilane (2) and at least one alkoxysilane selected from the group consisting of the alkoxysilanes (1) and (3) to (5).

4. The composition according to any one of items 1 to 3 above, wherein the solvent (C) further comprises at least one alcohol.

5. The composition according to any one of items 1 to 4 above, which further comprises (D) at least one acid capable of functioning as a catalyst for promoting a hydrolysis and dehydration-condensation reaction of the alkoxysilane (A).

6. The composition according to any one of items 1 to 5 above, wherein the organic polymer (B) is an aliphatic polyether comprising a polyalkylene glycol having $C_2$–$C_{12}$ ether group-containing recurring units and having a number average molecular weight of from 200 to 1,000,000.

7. The composition according to any one of items 1 to 6 above, wherein the organic polymer (B) is present in an amount of from 0.1 to 10 in terms of a weight ratio relative to the amount of a product obtained by subjecting the entire amount of the alkoxysilane (A) to a hydrolysis and dehydration-condensation reaction.

8. A silica-organic polymer composite thin film, which is produced by a process comprising:

forming a thin film of the composition of any one of items 1 to 7 above;

subjecting the thin film to a hydrolysis and dehydration-condensation reaction with respect to the alkoxysilane (A) thereof, to thereby cause the alkoxysilane (A) to be gelled in the thin film; and removing the solvent (C) remaining in the thin film by drying.

9. The silica-organic polymer composite thin film according to item 8 above, which has a thickness of from 0.1 to 100 μm.

10. The silica-organic polymer composite thin film according to item 8 or 9 above, which is transparent to visible rays having a wavelength of from 0.4 to 0.7 μm.

11. A multilevel interconnect comprising a plurality of insulating layers and circuits formed on the insulating layers, wherein at least one layer of the insulating layers comprises the silica-organic polymer composite thin film of any one of items 8 to 10 above.

12. A semiconductor device comprising the multilevel interconnect of item 11 above.

13. A porous silica thin film which is obtained by removing the organic polymer from the silica-organic polymer composite thin,film of any one of items 8 to 10 above.

14. The porous silica thin film according to item 13 above, which has an average pore diameter of from 1 to 500 nm.

15. The porous silica thin film according to item 13 or 14 above, wherein the removal of the organic polymer from the silica-organic polymer composite thin film is performed by calcining the composite thin film at a temperature of not higher than 450° C.

16. The porous silica thin film according to any one of items 13 to 15 above, which has a surface thereof treated with a silylating agent.

17. A multilevel interconnect comprising a plurality of insulating layers and circuits formed on the insulating layers, wherein at least one layer of the insulating layers comprises the porous silica thin film of any one of items 13 to 16 above.

18. A semiconductor device comprising the multilevel interconnect of item 17 above.

Hereinbelow, the present invention will be described in detail.

At least one alkoxysilane which is used as component (A) of the alkoxysilane/organic polymer composition of the present invention is selected from the group consisting of (1) tetraalkoxysilanes, (2) trialkoxysilanes, (3) dialkoxysilanes, (4) monoalkoxysilanes and (5) trialkoxysilane dimers, respectively, represented by the following formulae (1) to (5):

$$Si(OR)_4 \quad (1),$$

$$R^1Si(OR)_3 \quad (2),$$

$$R^1R^2Si(OR)_2 \quad (3),$$

$$R^1R^2R^3SiOR \quad (4),$$

and

 (5), wherein each R independently represents a straight chain or branched alkyl group having 1 to 6 carbon atoms, each of $R^1$, $R^2$ and $R^3$ independently represents a hydrogen atom or a monovalent hydrocarbon group having 1 to 6 carbon atoms, and $R^4$ represents a divalent hydrocarbon group having 1 to 6 carbon atoms. Examples of alkyl groups which can be suitably used as R in formulae (1), (2), (3), (4) and (5) above include a methyl group, an ethyl group, an n-propyl group, an i-propyl group, an n-butyl group, an i-butyl group and a t-butyl group. Examples of monovalent hydrocarbon groups which can be suitably used as $R^1$, $R^2$ and $R^3$ in formulae (2), (3) and (4) above include a methyl group and a phenyl group. Further, examples of divalent hydrocarbon groups which can be suitably used as $R^4$ in formula (5) above include a methylene group, an ethylene group, an isopropylidene group and a phenylene group.

It is preferred that the alkoxysilane (A) comprises at least one alkoxysilane selected from the group consisting of alkoxysilanes (1), (2) and (5), to which, if desired, at least one alkoxysilane selected from the group consisting of alkoxysilanes (3) and (4) is added.

It is especially preferred that the alkoxysilane (A) is:

1) a mixture of at least one of the above-mentioned alkoxysilane (1) and at least one alkoxysilane selected from the group consisting of the above-mentioned alkoxysilanes (2) to (5);

2) at least one of the above-mentioned trialkoxysilane (2); or 3) a mixture of at least one of the above-mentioned trialkoxysilane (2) and at least one alkoxysilane selected from the group consisting of the above-mentioned alkoxysilanes (1) and (3) to (5).

When the alkoxysilane (A) is at least one first alkoxysilane selected from the group consisting of the alkoxysilanes (3) and (4), the first alkoxysilane is used in combination with at least one second alkoxysilane selected from the group consisting of alkoxysilanes (1), (2) and (5).

When the alkoxysilane (A) is only at least one alkoxysilane selected from the group consisting of the alkoxysilanes (3) and (4), the alkoxysilane (A) cannot be gelled by a method in which a thin film obtained from the composition of the present invention for use in producing an insulating thin film is subjected to a hydrolysis and dehydration-condensation reaction with respect to the alkoxysilane (A) thereof. Therefore, in such a case, any of the silica-organic polymer composite thin film and porous silica thin film of the present invention described below cannot be obtained.

In the above-mentioned preferred form 1) of the alkoxysilane (A), when the amount of the at least one alkoxysilane selected from the group consisting of the above-mentioned alkoxysilanes (2) to (5) is reduced and the amount of the above-mentioned tetraalkoxysilane (1) is increased, the crosslinking density of the product obtained by the hydrolysis and dehydration-condensation reaction of the above-mentioned alkoxysilane (A) is increased, so that the mechanical strength of the silica-organic polymer composite thin film and porous silica thin film of the present invention described below is improved.

On the other hand, in the above-mentioned preferred form 1) of the alkoxysilane (A), when the amount of the above-mentioned tetraalkoxysilane (1) is reduced and the amount of the at least one alkoxysilane selected from the group consisting of the above-mentioned alkoxysilanes (2) to (5) is increased, the crosslinking density of the product obtained by the hydrolysis and dehydration-condensation reaction of the above-mentioned alkoxysilane (A) is lowered, so that the product has an improved cracking resistance. Further, when the hydrocarbon groups are directly bonded to the silicon atoms, the hygroscopicity of the above-mentioned reaction product is extremely reduced by the influence of the hydrocarbon groups.

At least a part of the alkoxysilane (A), which is at least one alkoxysilane selected from the group consisting of the above-mentioned alkoxysilanes (1) to (5), is optionally in the form of an oligomer, and at least a part of the alkoxysilane (A), which is at least one alkoxysilane selected from the group consisting of the above-mentioned alkoxysilanes (1) to (5), is optionally in or at least partially hydrolyzed form. Further, metal alkoxides which can be condensed with the above-mentioned alkoxysilanes (1) to (5) may be optionally added to the above-mentioned alkoxysilanes (1) to (5). Examples of such optional metal alkoxides include $C_1$–$C_6$ alkoxides of aluminum, titanium, zirconium, boron, magnesium, germanium, zinc, tin, niobium, lead, strontium, lithium and barium. Among these, $C_1$–$C_6$ alkoxides of aluminum, titanium and zirconium are preferred. The amount of the optional metal alkoxide is preferably 30% by weight or less, based on the weight of the alkoxysilane (A).

Specific examples of alkoxysilanes which can be used as the above-mentioned alkoxysilanes (1) to (5) include tetramethoxysilane, tetraethoxysilane, tetra(n-propoxy)silane, tetra(i-propoxy)silane, tetra(n-butoxy)silane, tetra(t-butoxy)silane, trimethoxysilane, triethoxysilane, methyltrimethoxysilane, methyltriethoxysilane, phenyltrimethoxysilane, phenyltriethoxysilane, dimethyldimethoxysilane, dimethyldiethoxysilane, diphenyldimethoxysilane, diphenyldiethoxysilane, phenyldimethoxysilane, phenyldiethoxysilane, methyldimethoxysilane, methyldiethoxysilane, phenylmethyldimethoxysilane, phenylmethyldiethoxysilane, trimethylmethoxysilane, trimethylethoxysilane, triphenylmethoxysilane, triphenylethoxysilane, phenyldimethylmethoxysilane, phenyldimethylethoxysilane, diphenylmethylmethoxysilane, diphenylmethylethoxysilane, dimethylmethoxysilane, dimethylethoxysilane, diphenylmethoxysilane, diphenylethoxysilane, bis(trimethoxysilyl)methane, bis(triethoxysilyl)methane, 1,2-bis(trimethoxysilyl)ethane, 1,2-bis(triethoxysilyl)ethane, 1,4-bis(trimethoxysilyl)benzene and 1,4-bis(triethoxysilyl)benzene. Among these, especially preferred are tetramethoxysilane, tetraethoxysilane, trimethoxysilane, triethoxysilane, methyltrimethoxysilane, methyltriethoxysilane, dimethyldimethoxysilane, dimethyldiethoxysilane, trimethylmethoxysilane and trimethylethoxysilane.

As is apparent from the below-mentioned specific examples of organic polymers usable as component (B), the organic polymer (B) of the alkoxysilane-organic polymer composition of the present invention comprises at least one organic polymer having a main chain mainly comprising at least one polymer chain selected from the group consisting of an aliphatic polyether chain having ether group-containing recurring units having 2 to 12 carbon atoms, an aliphatic polyester chain having ester group-containing recurring units having 2 to 12 carbon atoms, an aliphatic polycarbonate chain having carbonate group-containing recurring units having 2 to 12 carbon atoms and an aliphatic polyanhydride chain having anhydride group-containing recurring units having 2 to 12 carbon atoms.

The organic polymer (B) may be a single polymer or a mixture of a plurality of polymers. As long as the effect of the present invention is not adversely affected, the organic polymer (B) may optionally comprise a polymer chain having recurring units other than the above-mentioned recurring units. Further, the main chain of the organic polymer (B) may optionally have a functional group at terminals thereof. Usually, in a polyether, a polyester, a polycarbonate and a polyanhydride, the terminal groups are comprised of a hydroxyl group and/or a carboxyl group. However, the terminal groups of the main chain of the organic polymer (B) are not particularly limited to hydroxyl and carboxyl groups. As long as the effect of the present invention is not adversely affected, the terminal groups of the main chain of the organic polymer (B) may optionally be modified with other functional groups.

Examples of aliphatic polyethers having ether group-containing recurring units having 2 to 12 carbon atoms include polyalkylene glycols, such as polyethylene glycol, polypropylene glycol, polytrimethylene glycol, polytetramethylene glycol, polypentamethylene glycol, polyhexamethylene glycol, polydioxolane, polydioxepane and the like.

Examples of aliphatic polyesters having ester group-containing recurring units having 2 to 12 carbon atoms include polycondensation products of a hydroxycarboxylic acid and ring-opening polymerization reaction products of a lactone, such as polyglycolide, polycaprolactone, polycaprolactonetriol, polypivalolactone and the like; and polycondensation products of a dicarboxylic acid with an alkylene glycol, and ring-opening copolymerization products of an epoxide with an acid anhydride, such as polyethylene oxalate, polyethylene succinate, polyethylene adipate, polyethylene suberate, polyethylene sebacate, polypropylene adipate, polyoxydiethylene malonate, polyoxydiethylene adipate and the like.

Examples of aliphatic polycarbonates having carbonate group-containing recurring units having 2 to 12 carbon atoms include polycondensation reaction products of carbonic acid and alkylene glycols, such as polyethylene carbonate, polypropylene carbonate, polytrimethylene carbonate, polytetramethylene carbonate, polypentamethylene carbonate, polyhexamethylene carbonate and the like.

Examples of aliphatic polyanhydrides having anhydride group-containing recurring units having 2 to 12 carbon atoms include polycondensation reaction products of dicarboxylic acids, such as polymalonyl oxide, polyadipoyl oxide, polypimeloyl oxide, polysuberoyl oxide, polyazelaoyl oxide, polysebacoyl oxide and the like.

Of these, especially preferred are polyethylene glycol, polypropylene glycol, polycaprolactone, polycaprolactonetriol, polyethylene carbonate, polypentamethylene carbonate, polyhexamethylene carbonate, polyadipoyl oxide, polyazelaoyl oxide and polysebacoyl oxide.

The term "alkylene glycol" means a dihydric alcohol obtained by substituting an alkane having two or more carbon atoms with two hydroxyl groups so that two hydrogen atoms bonded to different carbon atoms in the alkane are replaced by the hydroxyl groups. The term "dicarboxylic acid" means an organic acid having two carboxyl groups, such as oxalic acid, malonic acid, succinic acid, glutaric acid, adipic acid, pimelic acid, suberic acid, azelaic acid, sebacic acid or the like.

When either aliphatic polymers other than the above-mentioned aliphatic polymers or aromatic polymers are used as organic polymer (B), problems arise in that the homogeneity of the silica-organic polymer composite thin film becomes poor and the required calcination temperature becomes high, thus rendering it difficult to produce any of the silica-organic polymer composite thin film and porous silica thin film of the present invention in the current process for producing a semiconductor device. However, for the purpose of adjusting the viscosity of the composition or improving the coating properties of the composition, other optional polymers may be used in addition to organic polymer (B) defined in the present invention, as long as the desired effects of the present invention are not impaired.

The amount of the organic polymer (B) in the composition of the present invention varies depending on the physical properties desired for the silica-organic polymer composite thin film or the porous silica thin film. Generally, the amount of the organic polymer (B) is $10^{-2}$ to 100, preferably $10^{-1}$ to 10, more preferably 0.5 to 5, in terms of a weight ratio relative to the amount of a product obtained by subjecting the entire amount of the alkoxysilane (A) to a hydrolysis and dehydration-condensation reaction. When the above-defined weight ratio of the organic polymer (B) is less than $10^{31\ 2}$, problems arise in that a large-thickness coating of the composition cannot be obtained, that a good silica-organic polymer composite thin film having a satisfactory crack resistance cannot be obtained, and that a porous silica thin film having a satisfactory void ratio cannot be obtained. On the other hand, when the above-defined weight ratio of the organic polymer (B) is larger than 100, problems arise in that any of the silica-organic polymer composite thin film and the porous silica thin film cannot have a satisfactory mechanical strength.

It is preferred that the organic polymer (B) has a number average molecular weight of from 200 to 1,000,000. It should be noted that the pore size of the porous silica thin film of the present invention is very small and has only a small dependency on the molecular weight of the organic polymer (B). This is a great difference between the present invention and the conventional technique, and such difference is one of the reasons why the composite thin film and porous silica thin film of the present invention are especially excellent as insulating layers for a multilevel interconnect for a semiconductor device.

In the alkoxysilane/organic polymer composition of the present invention, it is required that the solvent (C) for the alkoxysilane (A) and the organic polymer (B) comprise at least one organic solvent selected from the group consisting of amide linkage-containing organic solvents and ester linkage-containing organic solvents. If such a solvent is not used, a gelation of the alkoxysilane (A) by the hydrolysis and dehydration-condensation reaction of the alkoxysilane (A) does not proceed efficiently, leading to a problem that, when the organic polymer (B) is removed from the silica-organic polymer composite thin film, the silica-organic polymer composite thin film shrinks, thereby making it impossible to obtain a porous silica thin film having a high void ratio and hence a low dielectric constant. This is the reason why a porous film having a high void ratio cannot be obtained by the techniques disclosed in the above-mentioned Unexamined Japanese Patent Application Laid-Open Specification Nos. 8-245278 and 7-100389 and WO97/06896.

The solvent (C) used in the present invention, i.e., at least one organic solvent selected from the group consisting of amide linkage-containing organic solvents and ester linkage-containing organic solvents exhibits the effect to suppress an aggregation of the dispersed molecular chains of the organic polymer (B) in the silica-organic polymer composite film, thereby suppressing the growth of the polymer phase toward large particles. Generally, the interaction between silica and the organic polymer (B) used in the present invention is not strong. Therefore, if at least one organic solvent selected from the group consisting of amide linkage-containing organic solvents and ester linkage-containing organic solvents is not used as the solvent (C), a problem arises that, during the course of the gelation of the alkoxysilane (A) in the production of the silica-organic polymer composite thin film, an aggregation of the molecular chains of the organic polymer (B) occurs, thereby forming large particles of the organic polymer (B) in the obtained silica-organic polymer composite thin film. If a porous silica thin film is produced from a silica-organic polymer composite thin film containing such large particles of the organic polymer (B), the removal of the organic polymer (B) causes the formation of large pores in the porous silica thin film, wherein the large pores are likely to adversely affect the multilevel interconnect used as a semiconductor device.

The formation of a thin film is performed by coating a substrate with the composition of the present invention. As a method for forming a thin film, any conventional method, such as casting, immersing, spin coating and the like, can be employed. However, the spin coating method is suitable when the production of the insulating layer is intended in a current process for producing a multilevel interconnect for a semiconductor device. The thickness of the thin film can be controlled within the range of from 0.1 $\mu$m to 100 $\mu$m by varying the viscosity of the composition and the revolution rate of the spin coater. When the thickness of the thin film is larger than 100 $\mu$m, the thin film tends to suffer cracking. Generally, when the insulating layer is used in a multilevel interconnect for a semiconductor device, the suitable thickness of the insulating layer is 0.5 $\mu$m to 5 $\mu$m.

With respect to the solvent (C), it is preferred that the amount of at least one organic solvent selected from the group consisting of amide linkage-containing organic solvents and ester linkage-containing organic solvents in the solvent (C) is 1% by weight or more, based on the total weight of the solvent (C). If the amount of the above-mentioned at least one organic solvent is less than 1% by weight, based on the total weight of the solvent (C), an aggregation of the molecular chains of the organic polymer (B) occurs, thereby forming large particles of the organic polymer (B) in the silica-organic polymer composite thin film, so that a problem tends to arise that a porous silica thin film having a small pore size and a high void ratio cannot be obtained.

Examples of amide linkage-containing solvents usable in the present invention include amides, such as formamide, N-methylformamide, N-ethylformamide, N,N-dimethylformamide, N,N-diethylformamide, N-methylacetamide, N-ethylacetamide, N,N-dimethylacetamide, N,N-diethylacetamide, N-methylpyrrolidone, N-formylmorpholine, N-acetylmorpholine, N-formylpiperidine, N-acetylpiperidine, N-formylpyrrolidine, N-acethylpyrrolidine, N,N'-diformylpiperadine, N,N'-diacethylpiperadine and the like, and ureas, such as tetramethylurea, N,N'-dimethylimidazolidinone and the like. Examples of ester linkage-containing solvents usable in the present invention include ethyl formate, methyl acetate, ethyl acetate, ethyl lactate, ethylene glycol monomethyl ether acetate, ethylene glycol diacetate, propylene glycol monomethyl ether acetate, diethyl carbonate, ethylene carbonate, propylene carbonate and the like. Of these, particularly preferred are N,N-dimethylformamide, N,N-dimethylacetamide, N-methylpyrrolidone, tetramethylurea, N,N'-dimethylimidazolidinone, ethylene glycol monomethyl ether acetate, ethylene glycol diacetate and propylene glycol monomethyl ether acetate.

One solvent selected from the group consisting of amide linkage-containing organic solvents and ester linkage-containing organic solvents may be used alone as the solvent (C). However, when either a mixed solvent of at least two different organic solvents selected from the group consisting of amide linkage-containing organic solvents and ester linkage-containing organic solvents or a mixed solvent of at least one organic solvent selected from the group consisting of amide linkage-containing organic solvents and ester linkage-containing organic solvents and at least one organic solvent other than the amide linkage-containing and ester linkage-containing organic solvents is used as the solvent (C), advantages can be obtained in that the viscosity of the composition and the evaporation rate of the solvent (C) can be easily controlled. Preferred examples of other organic solvents which can be employed in combination with at least one organic solvent selected from the group consisting of amide linkage-containing organic solvents and ester linkage-containing organic solvents include alcohols, such as $C_1$–$C_4$ monohydric alcohols, $C_1$–$C_4$ dihydric alcohols, glycerol and the like; ethers, such as tetrahydrofuran, diethyl ether, di(n-propyl)ether, diisopropyl ether, diglyme, 1,4-dioxane, ethylene glycol monomethyl ether, ethylene glycol dimethyl ether, ethylene glycol diethyl ether, propylene glycol monomethyl ether, propylene glycol dimethyl ether and the like; ketones, such as acetone, methyl ethyl ketone, methyl propyl ketone, methyl(n-butyl)ketone, methyl isobutyl ketone, methyl amyl ketone, cyclopentanone, cyclohexanone and the like; nitriles, such as acetonitrile, propionitrile, n-butyronitrile, isobutyronitrile and the like; dimethyl sulfoxide, dimethyl sulfone, sulfolane and the like. Of these, particularly preferred are those solvents having a hydroxyl group, such as $C_1$–$C_4$ monohydric alcohols, $C_1$–$C_4$ dihydric alcohols, glycerol, ethylene glycol monomethyl ether and propylene glycol monomethyl ether. The reason why the use of such solvents having a hydroxyl group is preferred is because the use of such a solvent in the composition of the present invention improves the film forming properties of the composition, rendering it easy to form a thin film having a uniform film thickness.

It is preferred that the amount of the solvent (C) in the composition of the present invention is 0.05% by weight or more, based on the weight of the composition. If the amount of the solvent (C) is less than 0.05% by weight, based on the weight of the composition, a gelation of the alkoxysilane (A) by the hydrolysis and dehydration-condensation reaction thereof tends not to proceed efficiently, thereby rendering it difficult to produce not only a practically employable silica-organic polymer composite thin film but also a practically employable porous silica thin film.

The composition of the present invention may contain a substance which is capable of functioning as a catalyst for promoting the hydrolysis and dehydration-condensation reaction of the alkoxysilane (A). Examples of such substances which are capable of functioning as a catalyst include acids, such as hydrochloric acid, nitric acid, sulfuric acid, phosphoric acid, formic acid, acetic acid, oxalic acid, malonic acid, maleic acid, toluenesulfonic acid and the like; and bases, such as an aqueous ammonia solution, potassium hydroxide, sodium hydroxide, triethylamine, triethanolamine, pyridine, piperidine, choline and the like. However, if a base is used as a catalyst, the pore size of the porous silica thin film tends to become too large. Therefore, the use of an acid is preferred. Acids and bases may be used individually or in combination. Further, if desired, the composition may be stepwise treated using an acid and a base. Herein, the term "stepwise treated" means a mode in which, for example, the composition is treated first with an acid and then with a base. Alternatively, the acid and the base may also be used in the reverse order. In those cases, two different types of catalysts are added to the composition.

When a catalyst is employed, the amount of the catalyst is 1 mole or less, preferably $10^{-1}$ mole or less, per mole of the alkoxysilane (A). When the amount of the catalyst is more than 1 mole, per mole of the alkoxysilane (A), the catalyst tends to form a deposit, thereby rendering it difficult to obtain a homogeneous porous silica thin film.

Water is required for the hydrolysis of the alkoxysilane (A) in the present invention. The manner of supply of water is not specifically limited but can be made in any desired manner. For example, when a catalyst is employed, water may be added to the catalyst in advance. When a catalyst is added in an aqueous solution form, the water in the aqueous solution may be used for the hydrolysis of the alkoxysilane (A). Further, when the hydrolysis of alkoxysilane (A) is performed in an atmosphere containing a relatively large amount of steam and the amount of the steam is sufficient to effect the hydrolysis, it is unnecessary to supply water. The amount of water suitable for the hydrolysis of the alkoxysilane (A) is $10^4$ moles or less, preferably 10 moles or less, per mole of the silicon atoms contained in the alkoxysilane (A). When the amount of water used is more than $10^4$ moles, per mole of the silicon atoms contained in the alkoxysilane (A), the homogeneity of the silica-organic polymer composite thin film tends to become low.

If desired, various additives, such as a photocatalyst generator for imparting a photosensitivity, an agent for improving the adhesion to a substrate, and a stabilizer for a long-term storage, may be added to the composition of the present invention in such an amount as will not impair the effects of the present invention.

The silica-organic polymer composite thin film can be produced by a process comprising:

forming a thin film of the composition obtained by the above-mentioned manner;

subjecting the thin film to a hydrolysis and dehydration-condensation reaction with respect to the alkoxysilane (A) thereof, to thereby cause the alkoxysilane (A) to be gelled in the thin film; and removing the solvent (C) remaining in the thin film by drying.

In the present invention, the term "silica" means both $SiO_2$ and a compound having a structure wherein a hydrocarbon group and a hydrogen atom are bonded to silicon atoms, specifically a structure represented by the following formula;

$$R'_x H_y SiO_z$$

wherein R' represents a $C_1$–$C_6$ hydrocarbon group, $0 \leq x < 2$, $0 \leq y < 2$, $0 \leq (x+y) < 2$, and $1 < z \leq 2$.

The formation of a thin film is performed by coating a substrate with the composition of the present invention. As a method for forming a thin film, any conventional method, such as casting, immersing, spin coating and the like, can be employed. However, the spin coating method is suitable when the production of the insulating layer is intended in a current process for producing a multilayer circuit structure for a semiconductor device. The thickness of the thin film can be controlled within the range of from 0.1 μm to 100 μm by varying the viscosity of the composition and the revolution rate of the spin coater. When the thickness of the thin film is larger than 100 μm, the thin film tends to suffer cracking. Generally, when the insulating layer is used in a multilayer circuit structure for a semiconductor device, the suitable thickness of the insulating layer is 0.5 μm to 5 μm.

Examples of substrates include substrates comprised of a single element substance semiconductor, such as silicon or germanium, and substrates comprised of a compound semiconductor, such as gallium-arsenic or indium-antimony. These semiconductor substrates may be used in a form having formed thereon a thin film of a substance other than the substance used as a material for the substrate. Examples of substances for such a thin film formed on a semiconductor substrate include metals, such as aluminum, titanium, chromium, nickel, copper, silver, tantalum, tungsten, osmium, platinum, gold and the like; inorganic compounds, such as silicon dioxide, fluorinated glass, phosphate glass, borate-phosphate glass, borosilicate glass, polycrystalline silicon, alumina, titania, zirconia, silicon nitride, titanium nitride, tantalum nitride, boron nitride, hydrogen silsesquioxane; and organic polymers, such as methyl silsesquioxane, amorphous carbon, fluorinated amorphous carbon and polyimide.

Prior to the formation of a thin film of the composition on a substrate, the surface of the substrate may be treated with an agent for improving the adhesion to the thin film. As examples of agents for improving the adhesion to the thin film, there can be mentioned substances used as a so-called silane coupling agent or chelate compounds of aluminum. Especially preferred examples of agents for improving the adhesion include 3-aminopropyltrimethoxysilane, 3-aminopropyltriethoxysilane, N-(2-aminoethyl)-3-aminopropyltrimethoxysilane, N-(2-aminoethyl)-3-aminopropylmethyldimethoxysilane, vinyltrichlorosilane, vinyltriethoxysilane, 3-chloropropyltrimethoxysilane, 3-chloropropylmethyldichlorosilane, 3-chloropropylmethyldimethoxysilane, 3-chloropropylmethyldiethoxysilane, 3-mercaptopropyltrimethoxysilane, 3-glycidoxypropyltrimethoxysilane, 3-glycidoxypropylmethyldimethoxysilane, 3-methacryloxypropyltrimethoxysilane, 3-methacryloxypropylmethyldimethoxysilane, hexamethyldisilazane, (ethyl acetoacetato)aluminum diisopropylate, tris(ethyl acetoacetato)aluminum, bis(ethyl acetoacetato)aluminum monoacetylacetonate, tris (acetylacetonato)aluminum and the like. If desired, when the agent for improving an adhesion to the thin film is applied onto a substrate, other additives may be added to the agent, and the agent may be diluted with a solvent. The treatment of the surface of the substrate with the agent for improving an adhesion to the thin film is conducted by a known method.

When alkoxysilane (A) in the thin film which is obtained by the above-mentioned method is gelled by a hydrolysis and dehydration-condensation reaction, a reaction product having a three dimensional network structure similar to the structure of silicon dioxide is obtained.

There is no particular limitation with respect to the temperature for the hydrolysis and dehydration-condensation reaction of alkoxysilane (A) (hereinbelow, this temperature is simply referred to as "reaction temperature"). However, the reaction temperature is usually 0 to 180° C., preferably 30 to 150° C. When the reaction temperature is lower than 0° C., the reaction rate becomes small, so that the time required for the satisfactory gelation of the alkoxysilane (A) becomes disadvantageously long. On the other hand, when the reaction temperature is higher than 180° C., formation of large voids tends to occur, so that the homogeneity of the below-mentioned silica-organic composite thin film is lowered. The time for the hydrolysis and dehydration-condensation reaction of alkoxysilane (A) varies depending on the temperature of the heat treatment, the amount of the catalyst and the like. However, usually, the reaction is completed within several minutes to several days.

In general, the gelation of the alkoxysilane (A) occurs simultaneously with the evaporation of at least a part of the solvent (C). However, by using a solvent having an appropriate boiling point and, if desired, an appropriate type of a catalyst in an appropriate amount, it is possible to control the rate of the gelation of the alkoxysilane (A) and the rate of the evaporation of the solvent (C).

In many cases, when the solvent (C) is appropriately selected so that at least a part of the solvent (C) remains in the thin film until the gelation of the alkoxysilane (A) satisfactorily proceeds, favorable results can be obtained. When the solvent (C) remains in the thin film at the point in time of completion of the gelation of the alkoxysilane (A), the thin film is subsequently subjected to drying so as to remove the solvent (C) remaining in the thin film. Needless to say, the temperature for drying varies depending on the type of the solvent (C). Usually, the temperature for drying is 30 to 250 ° C. It is also effective to perform the drying under a reduced pressure. It is also preferred that the drying is performed while gradually elevating the temperature so as to avoid the occurrence of voids and obtain a homogeneous silica-organic polymer composite thin film.

By the above-mentioned method, a silica-organic polymer composite thin film can be obtained. The organic polymer (B) is dispersed in the obtained composite thin film almost in the form of molecular chains without suffering aggregation. When the above-mentioned dispersion of the molecular chains of the organic polymer (B) in the composite thin film is achieved, the composite thin film is transparent to visible rays having a wavelength of 0.4 to 0.7 $\mu$m.

The thus obtained silica-organic polymer thin film has a low dielectric constant, as compared to the silicon dioxide obtained using only alkoxysilane(s). Further, the thickness of the silica-organic polymer thin film can be rendered satisfactorily large. Therefore, the silica-organic polymer thin film as such can be used as an insulating layer for a multilevel interconnect for a semiconductor device. However, in order to obtain an insulating layer for a multilevel interconnect for a semicondensor device, which has a further lower dielectric constant, it is preferred that this composite thin film is converted to a porous silica thin film. The composite thin film can be converted to a porous silica thin film by removing the organic polymer (B) from the composite thin film. If the gelation of the alkoxysilane (A) has satisfactorily proceeded, when the organic polymer (B) is removed from the composite thin film, the spaces in the composite thin film, which had been occupied by the molecular chains of the organic polymer (B), are not collapsed but left as pores in the porous silica thin film. As a result, a porous silica thin film having a high void ratio and hence a low dielectric constant can be obtained.

Examples of methods for removing the organic polymer (B) include calcination by heating, plasma treatment, solvent extraction and the like. Among these methods, calcination by heating is preferred since calcination by heating can be easily performed in the current process for producing a semiconductor device. When the organic polymer (B) is removed by calcination, the calcination temperature varies depending on the type of the organic polymer (B) used. The calcination temperature is usually 300 to 500° C., preferably 350 to 450° C. When the calcination temperature is higher than 500° C., the pores of the resultant porous silica thin film are likely to be collapsed, so that the thickness of the thin film is extremely decreased and the dielectric constant of the thin film becomes disadvantageously high. On the other hand, when the calcination temperature is lower than 300° C., the organic polymer (B) is not satisfactorily decomposed, so that some organic substances derived from the organic polymer (B) may remain in the resultant porous silica thin film as impurities, and, hence, it becomes difficult to obtain a porous silica thin film having a low dielectric constant.

The calcination is conducted for 1 minute to 24 hours. When the calcination time is shorter than 1 minute, the organic polymer (B) is not satisfactorily decomposed, so that some organic substances derived from the organic polymer (B) may remain in the resultant porous silica thin film as impurities, and, hence, to it becomes difficult to obtain a porous silica thin film having a low dielectric constant. In general, thermal decomposition of the organic polymer (B) is completed within 24 hours. Therefore, a long-time calcination for more than 24 hours is useless.

The calcination can be conducted in an atmosphere of an inert gas, such as argon, helium and the like, or in an oxidizing atmosphere, such as an atmosphere of an oxygen-containing gas (for example, air and the like). In general, when the calcination is conducted in an oxidizing atmosphere, the calcination temperature tends to be lowered and the calcination time tends to become short. When the calcination is conducted in an atmosphere of a gas containing ammonia or hydrogen, nitridation or hydrogenation of the porous silica thin film occurs due to the reaction of the silanol groups remaining in the product obtained by the hydrolysis and dehydration-condensation reaction of alkoxysilane (A), so that the hygroscopicity of the resultant porous silica thin film can be advantageously lowered.

The silica-organic polymer composite thin film and porous silica thin film, each of which is obtained from the composition of the present invention, can be fabricated into a desired shape by a conventional method used in a current process for producing a semiconductor device.

Surface treatment of the obtained porous silica thin film with a silylating agent is effective for lowering the hygroscopicity of the porous silica thin film and improving the adhesion of the porous silica thin film to other substances. Examples of silylating agents include alkoxysilanes, such as trimethylmethoxysilane, trimethylethoxysilane, dimethyldimethoxysilane, dimethyldiethoxysilane, methyltrimethoxysilane, methyltriethoxysilane, dimethylethoxysilane, methyldiethoxysilane, dimethylvinylmethoxysilane, dimethylvinylethoxysilane, diphenyldimethoxysilane, diphenyldiethoxysilane, phenyltrimethoxysilane and phenyltriethoxysilane; chlorosilanes, such as trimethylchlorosilane, dimethyldichlorosilane, methyltrichlorosilane, methyldichlorosilane, dimethylchlorosilane, dimethylvinylchlorosilane, methylvinyldichlorosilane, methylchlorodisilane, triphenylchlorosilane, methyldiphenylchlorosilane and diphenyldichlorosilane; and silazanes, such as hexamethyldisilazane, N,N'-bis(trimethylsilyl)urea, N-(trimethylsilyl)acetamide, dimethyl(trimethylsilyl)amine, diethyl(triethylsilyl)amine and trimethylsilylimidazole. Examples of methods for the silylation include application of the silylating agent by coating, immersing in the silylating agent or a solution thereof, exposure to the vapor of the silylating agent, and the like.

In a current process for producing a semiconductor device, a silicon oxide insulating layer for a multilevel interconnect for a semiconductor device is produced by a method comprising dissolving a silicon oxide precursor in an appropriate solvent to thereby obtain a solution of the silicon oxide precursor, forming a coating of the obtained solution on a substrate by spin coating technique or the like, and calcining the coating at an appropriate temperature. When the alkoxysilane/organic polymer composition of the present invention {which comprises (A) a specific alkoxysilane; (B) a specific organic polymer; and (C) a solvent for alkoxysilane (A) and organic polymer (B), wherein solvent (C) comprises at least one organic solvent selected from the group consisting of amide linkage-containing organic solvents and ester linkage-containing organic solvents} is used in place of the above-mentioned solution of the silicon oxide precursor and subjected to a treatment similar to the above-mentioned current process for producing an insulating thin film, an insulating layer of a multilevel interconnect for a semiconductor device, which has a low dielectric constant, can be easily produced.

When the composition of the present invention is used, a silica-organic polymer composite thin film having a low dielectric constant or a porous silica thin film having micropores in a high void ratio and hence having a low dielectric constant can be obtained by a method which can be easily performed in the conventional process for producing a semiconductor device without any special equipment. Therefore, the composition of the present invention is extremely useful as a material for an insulating layer for a multilevel interconnect, which has a low dielectric constant, especially as a material for an insulating layer for a multilevel interconnect for an LSI.

BEST MODE FOR CARRYING OUT THE INVENTION

Hereinbelow, the present invention will be described in more detail with reference to the following Examples and Comparative Examples, which should not be construed as limiting the scope of the present invention.

In the following Examples and Comparative Examples, various properties of a silica-organic polymer composite thin film and of a porous silica thin film were evaluated by the following methods.

(1) Measurement of the surface area ($N_2$ BET): Measurement was performed by means of Nitrogen Adsorption Isotherm Surface Area Measurement Apparatus (manufactured and sold by Shimadzu Corporation, Japan).

(2) Measurement of the film thickness: Measurement was performed by means of DEKTAK-II A Model surface roughness measurement apparatus (manufactured and sold by Sloan Technology Corporation, U.S.A).

(3) Measurement of the dielectric constant: Measurement was performed by means of HP4280 Model C-V measurement apparatus (manufactured and sold by Hewlett-Packard Company, U.S.A).

(4) Evaluation of the transparency: Evaluation was made by the following method. A silica-organic polymer composite thin film is cut into a slice having a thickness of 1 mm. The slice was placed on a plate carrying a black character having a size of 3 mm×3 mm so that the character is covered by the slice. The character is then visually observed through the slice. If the character is legible through the slice, the slice is evaluated as being transparent.

The number average molecular weight (Mn) of an organic polymer used herein was measured by gel permeation chromatography (GPC) using tetrahydrofuran as an eluent and using a calibration curve obtained with respect to standard monodispersed polystyrene systems.

The following abbreviations are used in Tables 1 to 7 showing the data of Examples and Comparative Examples.

TEOS: tetraethoxysilane,
MTES: methyltriethoxysilane,
TMOS: tetramethoxysilane,
MTMS: methyltrimethoxysilane,
PEG: polyethylene glycol,
PCL: polycaprolactone,
PC: poly(pentamethylene-hexamethylene carbonate),
PVEE: polyvinyl ethyl ether,
PVdF: polyvinylidene fluoride,
NMP: N-methylpyrrolidone,
DMF: N,N-dimethylformamide,
EA: ethyl acetate,
EtOH: ethanol, and
MeOH: methanol

EXAMPLE 1

1.2 g of tetraethoxysilane and 0.34 g of polyethylene glycol (number average molecular weight: 20,000) were dissolved in 2.0 g of N-methylpyrrolidone. Then, added thereto were 0.30 g of water and 0.15 g of 0.10 N nitric acid, and the resultant solution was stirred for 2 hours at room temperature. This solution was cast onto a polytetrafluoroethylene watch-glass and allowed to stand for 1 hour at 120° C. to thereby cause the tetraethoxysilane to be gelled. The resultant gel was dried in vacuum at 180° C., to thereby obtain a silica-organic polymer composite thin film. The obtained composite thin film was transparent.

EXAMPLES 2 TO 14

Substantially the same procedure as in Example 1 was repeated, except that the types of the alkoxysilane, the organic polymer and the solvent were varied. The types and amounts of alkoxysilanes, organic polymers and solvents which were employed and the obtained results are shown in Table 1. The term "weight of gel" indicated in Table 1 means the weight of a hydrolysis and dehydration-condensation reaction product of an alkoxysilane employed, as determined by calculation, based on the assumption that the entire amount of the alkoxysilane undergoes a hydrolysis and dehydration-condensation reaction.

All of the obtained silica-organic polymer thin films were transparent.

TABLE 1

| Example No. | Alkoxy-silane | Amount of alkoxy-silane (g) | Weight of gel (g) | Polymer | Molecular weight of polymer | Amount of polymer (g) | Solvent | Appearance of gel |
|---|---|---|---|---|---|---|---|---|
| 1 | TEOS | 1.2 | 0.34 | PEG | 20000 | 0.34 | NMP | Transparent |
| 2 | TEOS | 1.2 | 0.34 | PEG | 20000 | 0.68 | NMP | Transparent |
| 3 | MTES | 0.9 | 0.34 | PEG | 20000 | 0.34 | DMF | Transparent |
| 4 | MTES | 0.9 | 0.34 | PEG | 600 | 0.51 | NMP | Transparent |
| 5 | MTMS | 0.7 | 0.34 | PEG | 20000 | 0.34 | NMP | Transparent |
| 6 | MTMS | 0.7 | 0.34 | PEG | 1000 | 0.68 | EA | Transparent |
| 7 | TMOS + MTMS (1/1) | 0.8 | 0.34 | PEG | 2000 | 0.51 | EA | Transparent |
| 8 | TEOS | 1.2 | 0.34 | PCL | 600 | 0.34 | DMF | Transparent |
| 9 | MTMS | 0.7 | 0.34 | PCL | 600 | 0.34 | DMF | Transparent |
| 10 | MTMS | 0.7 | 0.34 | PC | 20000 | 0.34 | NMP | Transparent |
| 11 | TEOS | 1.2 | 0.34 | PEG | 20000 | 0.68 | NMP + EtOH (2/8) | Transparent |
| 12 | MTES | 0.9 | 0.34 | PEG | 20000 | 0.85 | NMP + EtOH (2/8) | Transparent |
| 13 | MTMS | 0.7 | 0.34 | PEG | 600 | 1.05 | DMF + EG (5/5) | Transparent |
| 14 | MTMS | 0.7 | 0.34 | PEG | 20000 | 0.34 | NMP + MeOH (3/7) | Transparent |

Comparative Examples 1 to 4

Substantially the same procedure as in Example 1 was repeated, except that polyvinyl ethyl ether (PVEE) and polyvinylidene fluoride (PVdF) were used as organic polymers. The results are shown in Table 2. A transparent and homogeneous gel could not be obtained in Comparative Examples 1 to 4.

TABLE 2

| Compara. Ex. No. | Alkoxy-silane | Amount of alkoxy-silane (g) | Weight of gel (g) | Polymer | Molecular weight of polymer | Amount of polymer (g) | Solvent | Gelation |
|---|---|---|---|---|---|---|---|---|
| 1 | TEOS | 1.2 | 0.34 | PVEE | 3800 | 0.34 | NMP | Homogeneous gelation did not occur. |
| 2 | TEOS | 1.2 | 0.34 | PVdF | 71000 | 0.34 | DMF | Opaque gel was formed. |
| 3 | MTMS | 0.7 | 0.34 | PVdF | 71000 | 0.34 | NMP | Opaque gel was formed. |
| 4 | MTMS | 0.7 | 0.34 | PVdF | 71000 | 0.34 | EA | Opaque gel was formed. |

EXAMPLES 15 TO 26

0.17 g of one polymer selected from the group consisting of polyethylene glycol (number average molecular weight: 20,000), polycaprolactone (number average molecular weight: 600) and polypentamethylene-hexamethylene carbonate (number average molecular weight: 2,000) was dissolved in 1.5 g of one solvent selected from the group consisting of N,N-dimethylformamide (DMF), N-methylpyrrolidone (NMP), ethyl acetate and a mixed solvent (weight ratio: 6/4) of tetrahydrofuran (THF) and DMF. Then, added thereto were 0.60 g of tetraethoxysilane (corresponding to 0.17 g in terms of $SiO_2$) and 0.15 g of 0.1 N hydrochloric acid, and the resultant solution was stirred for 1 hour at room temperature. When 0.5 g of 0.1 N aqueous ammonia solution was added to this solution, tetraethoxysilane gelled rapidly and the whole of the solution became a jelly-like product.

As shown in Table 3, all of the obtained jelly-like products were colorless and transparent.

TABLE 3

| | | Appearance of gel | | | |
|---|---|---|---|---|---|
| Example No. | Polymer | DMF | NMP | Ethyl acetate | THF + DMF (6/4) |
| 15–18 | PEG | T | T | T | T |
| 19–22 | PCL | T | T | T | T |
| 23–26 | PC | T | T | T | T |

T: Transparent, O: Opaque

Comparative Examples 5 to 7

Substantially the same procedures as in Examples 15 to 26 were repeated, except that acetonitrile was used as the solvent. As shown in Table 4, all of the obtained jelly-like products were white opaque.

TABLE 4

| Compara. Ex. No. | Polymer | Appearance of gel Acetonitrile |
|---|---|---|
| 5 | PEG | O |
| 6 | PCL | O |
| 7 | PC | O |

T: Transparent, O: Opaque

EXAMPLE 27

0.43 g of ETHYL SILICATE 40 (manufactured and sold by Colcoat Kabushiki Kaisha, Japan) and 0.17 g of polypropylene glycol (number average molecular weight: 4,000) were dissolved in a mixed solvent of 1.2 g of dimethylformamide and 0.8 g of ethanol. Then, added thereto was 0.2 g of 0.1 N aqueous ammonia solution. The resultant solution was cast onto a petri dish so as to form a thin film thereon. Then, the petri dish was sealedly covered and allowed to stand overnight at room temperature to thereby cause ETHYL SILICATE 40 to be gelled. Subsequently, the temperature of the atmosphere surrounding the thin film was gradually elevated from 60° C. to 120° C. and then the pressure of the atmosphere surrounding the thin film was reduced to vacuum while maintaining the temperature at 120° C., thereby drying the thin film, thus obtaining a transparent silica-organic polymer composite thin film having a thickness of 1.3 mm. The obtained composite thin film was calcined for 2 hours at 450° C. in air, thereby removing the organic polymer to obtain a porous silica thin film. The specific surface area of the obtained porous silica thin film was measured by nitrogen adsorption isotherm method, and was found to be 990 $m^2/g$. This value indicates that the pore diameter of the obtained porous silica thin film is small.

Comparative Example 8

0.43 g of ETHYL SILICATE 40 (manufactured and sold by Colcoat Kabushiki Kaisha, Japan) and 0.17 g of polystyrene were dissolved in 2.0 g of methyl ethyl ketone. Further, added thereto was 0.2 g of 0.1 N aqueous ammonia solution. The resultant solution was cast onto a petri dish to thereby form a thin film. Then, the petri dish was sealedly covered and allowed to stand overnight at room temperature to thereby cause ETHYL SILICATE 40 to be gelled. Subsequently, the temperature of the atmosphere surrounding the thin film was gradually elevated from 60 to 120° C. and then the pressure of the atmosphere surrounding the thin film was reduced to vacuum while maintaining the temperature at 120° C., thereby drying the thin film, thus obtaining an opaque silica-organic polymer composite thin film. The obtained composite thin film was calcined for 2 hours at 450° C. in air, thereby removing the organic polymer to obtain a porous silica thin film. The specific surface area of the obtained porous silica thin film was measured using 0.13 g of the porous silica thin film, and found to be as small as 1 $m^2/g$ or less. This indicates that the pore diameter of the obtained porous silica thin film is large.

EXAMPLE 28

1.2 g of tetraethoxysilane (TEOS) and 0.17 g of polyethylene glycol (number average molecular weight: 20,000) were dissolved in a mixed solvent (weight ratio: 2/1) of N,N'-dimethylimidazolidinone and propylene glycol methyl ether acetate. Then, added thereto were 0.5 g of water and 0.15 g of 0.1 N hydrochrolic acid, and the resultant solution was stirred for 4 hours.

A silicon wafer having a titanium nitride thin film thereon was coated with the above solution by spin coating (revolution rate: 1,500 rpm) to thereby form a thin film. The formed thin film was heated for 1 hour at 120° C. so as to effect a gelation of the tetraalkoxysilane and remove the solvent, thereby obtaining a silica-organic polymer composite thin film.

The obtained composite thin film was calcined for 1 hour at 450° C. in an atmosphere of nitrogen gas to thereby remove the organic polymer, thereby obtaining a porous silica thin film. The obtained porous silica thin film was placed in a pressure vessel, and the internal pressure of the pressure vessel was reduced to vacuum. Then, a vapor of hexamethyldisilazane was introduced into the pressure vessel at room temperature, to thereby modify the pore surfaces with trimethylsilyl groups so as to render the pore surfaces hydrophobic. The upper surface of this thin film was coated with aluminum by vacuum deposition through a SUS mask to thereby form an electrode having a diameter of 1.7 mm. Using the thus obtained electrode-carrying porous silica thin film, the dielectric constant of the porous silica thin film was measured at 1 MHz. The dielectric constant of the porous silica thin film was found to be 3.5, which is remarkably lower than the dielectric constant (4.5) of $SiO_2$.

EXAMPLES 29 TO 32

Substantially the same procedure as in Example 28 was repeated, except that the amount of polyethylene glycol was varied. The results of the dielectric constant measurement are shown in Table 5. As shown in Table 5, all of the obtained porous silica thin films exhibited low dielectric constant values.

TABLE 5

| Example No. | Alkoxy-silane | Polymer | Polymer/silica weight ratio | Thickness of composite film ($\mu$m) | Thickness of film after calcination ($\mu$m) | Ratio of decrease in thickness | Dielectric constant (1 MHz) |
|---|---|---|---|---|---|---|---|
| 28 | TEOS | PEG | 0.5 | 0.65 | 0.48 | 26% | 3.5 |
| 29 | TEOS | PEG | 1.0 | 1.19 | 0.83 | 30% | 2.7 |
| 30 | TEOS | PEG | 1.5 | 0.93 | 0.63 | 32% | 2.5 |
| 31 | TEOS | PEG | 2.0 | 1.02 | 0.64 | 37% | 2.2 |
| 32 | TEOS | PEG | 3.0 | 1.09 | 0.71 | 35% | 1.7 |

EXAMPLE 33

0.70 g of methyltrimethoxysilane (MTMS) and 0.17 g of polyethylene glycol (number average molecular weight: 20,000) were dissolved in a mixed solvent (weight ratio:

2/1/4) of N-methylpyrrolidone, propylene glycol methyl ether acetate and methanol. Then, added thereto were 0.30 g of water and 0.15 g of 0.1 N nitric acid, and the resultant solution was stirred for 3 hours.

A silicon wafer having a titanium nitride thin film thereon was coated with the above solution by spin coating (revolution rate: 1,500 rpm) to thereby form a thin film. The formed thin film was heated for 1 hour at 120° C. so as to effect a gelation of MTMS and remove the solvent, thereby obtaining a silica-organic polymer composite thin film.

The obtained composite thin film was calcined for 1 hour at 450° C. in an atmosphere of nitrogen gas to thereby remove the organic polymer, thereby obtaining a porous silica thin film. The upper surface of this thin film was coated with aluminum by vacuum deposition through a SUS mask to thereby form an electrode having a diameter of 1.7 mm. Using the thus obtained electrode-carrying porous silica thin film, the dielectric constant of the porous silica thin film was measured at 1 MHz. The dielectric constant of the porous silica thin-film was found to be 2.8, which is lower than the dielectric constant (3.1) of $CH_3SiO_{1.5}$.

EXAMPLES 34 TO 36

Substantially the same procedure as in Example 33 was repeated, except that the amount of polyethylene glycol was varied. The results of the dielectric constant measurement are shown in Table 6. As shown in Table 6, all of the obtained porous silica thin films exhibited low dielectric constant values.

ethylene glycol was varied. The results of the measurement of the ratio of decrease in the film thickness are shown in Table 7. As shown in Table 7, the calcination caused a marked decrease in the film thickness in Comparatives Examples 10 and 11.

TABLE 7

| Compara. Ex. No. | Alkoxy-silane | Polymer | Polymer/silica weight ratio | Thickness of composite film ($\mu$m) | Thickness of film after calcination ($\mu$m) | Ratio of decrease in thickness |
|---|---|---|---|---|---|---|
| 9 | MTMS | PEG | 0.5 | 0.87 | 0.45 | 48% |
| 10 | MTMS | PEG | 1.0 | 0.36 | 0.14 | 61% |
| 11 | MTMS | PEG | 1.5 | 1.14 | 0.47 | 59% |

EXAMPLE 37

0.6 g of methyltrimethoxysilane and 0.1 g of polysebacic anhydride (number average molecular weight: 1,900) were dissolved in 1.0 g of N,N-dimethylformamide. Then, added thereto were 0.05 g of water and 0.1 g of 0.1 N hydrochloric acid, and the resultant solution was stirred for 1 hour at room temperature. This solution was cast onto a polytetrafluoroethylene watch glass to thereby form a thin film, and the formed thin film was allowed to stand for 1 hour at 100° C. to thereby cause the methyltrimethoxysilane to be gelled. Then, the thin film was dried in vacuum at 180° C., thereby obtaining a silica-organic polymer composite thin film. The dried composite thin film was transparent.

TABLE 6

| Example No. | Alkoxy-silane | Polymer | Polymer/silica weight ratio | Thickness of composite film ($\mu$m) | Thickness of film after calcination ($\mu$m) | Ratio of decrease in thickness | Dielectric constant (1 MHz) |
|---|---|---|---|---|---|---|---|
| 33 | MTMS | PEG | 0.5 | 1.03 | 0.74 | 28% | 2.8 |
| 34 | MTMS | PEG | 1.0 | 0.94 | 0.63 | 33% | 2.4 |
| 35 | MTMS | PEG | 1.5 | 1.06 | 0.67 | 37% | 2.1 |
| 36 | MTMS | PEG | 3.5 | 1.00 | 0.64 | 36% | 1.6 |

Comparative Example 9

0.70 g of methyltrimethoxysilane (MTMS) and 0.17 g of polyethylene glycol (number average molecular weight: 20,000) were dissolved in methanol. Then, added thereto were 0.30 g of water and 0.15 g of 0.1 N nitric acid, and the resultant solution was stirred for 2 hours.

A silicon wafer was coated with the above solution by spin coating (revolution rate: 1,500 rpm) to thereby form a thin film. The formed thin film was heated for 1 hour at 120° C. so as to effect a gelation of MTMS and remove the solvent, thereby obtaining a silica-organic polymer composite thin film having a thickness of 0.87 $\mu$m.

The obtained composite thin film was calcined for 1 hour at 450° C. in an atmosphere of nitrogen gas to thereby remove the organic polymer, thereby obtaining a porous silica thin film. The thickness of the porous silica thin film was 0.45 $\mu$m, indicating that the calcination caused a thickness decrease as large as 48%, based on the thickness of the silica-organic polymer composite thin film. It is presumed that pores which should have been formed when the organic polymer was removed by calcination were collapsed.

Comparative Examples 10 and 11

Substantially the same procedure as in Comparative Example 9 was repeated, except that the amount of poly-

INDUSTRIAL APPLICABILITY

Both of the silica-organic polymer composite thin film (which is produced by a process comprising: forming a thin film of the alkoxysilane/organic polymer composition of the present invention; subjecting the thin film to a hydrolysis and dehydration-condensation reaction with respect to the alkoxysilane thereof, to thereby cause the alkoxysilane to be gelled in the thin film; and removing the solvent remaining in the thin film by drying) and the porous silica thin film (which is obtained by removing the organic polymer from the silica-organic polymer composite thin film) have advantages not only in that these thin films have a low dielectric constant suitable for insulating layers for a multilevel interconnect for a semiconductor-device, but also in that these thin films can be produced by a method which can be easily performed in the current process for producing a semiconductor device. Therefore, the alkoxysilane/organic polymer composition of the present invention for use in producing an insulating thin film can be very advantageously used for producing an insulating layer for a multilevel interconnect for a semiconductor device, such as an LSI.

What is claimed is:

1. An alkoxysilane/organic polymer composition for use in producing an insulating thin film, comprising:

(A) at least one alkoxysilane selected from the group consisting of (1) tetraalkoxysilanes, (2) trialkoxysilanes, (3) dialkoxysilanes, (4) monoalkoxysilanes and (5) trialkoxysilane dimers, respectively, represented by the following formulae (1), (2), (3), (4) and (5):

$$Si(OR)_4 \quad (1),$$

$$R^1Si(OR)_3 \quad (2),$$

$$R^1R^2Si(OR)_2 \quad (3),$$

$$R^1R^2R^3SiOR \quad (4),$$

and $$(RO)_3Si-R^4-Si(OR)_3 \quad (5),$$

wherein each R independently represents a straight chain or branched alkyl group having 1 to 6 carbon atoms, each of $R^1$, $R^2$ and $R^3$ independently represents a hydrogen atom or a monovalent hydrocarbon group having 1 to 6 carbon atoms, and $R^4$ represents a divalent hydrocarbon group having 1 to 6 carbon atoms, and wherein, when said alkoxysilane (A) is at least one first alkoxysilane selected from the group consisting of said alkoxysilanes (3) and (4), said first alkoxysilane is used in combination with at least one second alkoxysilane selected from the group consisting of said alkoxysilanes (1), (2) and (5);

(B) at least one organic polymer having a main chain mainly comprising at least one polymer chain selected from the group consisting of an, aliphatic polyether chain having ether group-containing recurring units having 2 to 12 carbon atoms, an aliphatic polycarbonate chain having carbonate group-containing recurring units having 2 to 12 carbon atoms and an aliphatic polyanhydride chain having anhydride group-containing recurring units having 2 to 12 carbon atoms;

(C) a solvent for said alkoxysilane (A) and said organic polymer (B), wherein said solvent (C) comprises at least one organic solvent selected from the group consisting of amide linkage-containing organic solvents and ester linkage-containing organic solvents; and (D) at least one acid capable of functioning as a catalyst for promoting a hydrolysis and dehydration-condensation reaction of said alkoxysilane (A), wherein said acid is used in an amount of 1 mole or less, per mole of said alkoxysilane (A), and wherein at least a part of said alkoxysilane (A), which is at least one alkoxysilane selected from the group consisting of said alkoxysilanes (1) to (5), is optionally in at least one form selected from the group consisting of an oligomer form and an at least partially hydrolyzed form.

2. The composition according to claim 1, wherein said alkoxysilane (A) is a mixture of at least one tetraalkoxysilane (1) and at least one alkoxysilane selected from the group consisting of said alkoxysilanes (2) to (5).

3. The composition according to claim 1, wherein said alkoxysilane (A) is at least one trialkoxysilane (2), or a mixture of at least one trialkoxysilane (2) and at least one alkoxysilane selected from the group consisting of said alkoxysilanes (1) and (3) to (5).

4. The composition according claim 1, wherein said solvent (C) further comprises at least one alcohol.

5. The composition according to claim 1, wherein said organic polymer (B) is an aliphatic polyether comprising a polyalkylene glycol having $C_2$–$C_{12}$ ether group-containing recurring units and having a number average molecular weight of from 200 to 1,000,000.

6. The composition according to claim 1, wherein said organic polymer (B) is present in an amount of from 0.1 to 10 in terms of a weight ratio relative to the amount of a product obtained by subjecting the entire amount of said alkoxysilane (A) to a hydrolysis and dehydration-condensation reaction.

7. A silica-organic polymer composite thin film, which is produced by a process comprising:

forming a thin film of the composition of claim 1;

subjecting said thin film to a hydrolysis and dehydration-condensation reaction with respect to said alkoxysilane (A) thereof, to thereby cause said alkoxysilane (A) to be gelled in said thin film, wherein said organic polymer (B) is dispersed in said thin film substantially in the form of moleculer chains; and removing said solvent (C) remaining in said thin film by drying.

8. The silica-organic polymer composite thin film according to claim 7, which has a thickness of from 0.1 to 100 μm.

9. The silica-organic polymer composite thin film according to claim 7, which is transparent to visible rays having a wavelength of from 0.4 to 0.7 μm.

10. A multilevel interconnect comprising a plurality of insulating layers and circuits formed on said insulating layers, wherein at least one layer of said insulating layers comprises the silica-organic polymer composite thin film of claim 7.

11. A semiconductor device comprising the multilevel interconnect of claim 10.

12. The silica-organic polymer composite thin film according to claim 7, which is for use as at least one layer of a plurality of insulating layers for a multilevel interconnect, wherein said interconnect comprises said plurality of insulating layers and circuits formed on said insulating layers.

13. A process for producing a porous silica thin film, comprising removing the organic polymer from the silica-organic polymer composite thin film of claim 7 by calcining said composite thin film at a temperature of not higher than 450° C. in an inert gas and wherein, when the alkoxysilane (A) is a tetraalkoxysilane (1), treating a pore surface of said porous silica thin film with a silylating agent.

14. The process according to claim 13, wherein said porous silica thin film has an average pore diameter of from 1 to 500 nm.

* * * * *